(12) United States Patent
Yamashita et al.

(10) Patent No.: US 11,284,017 B2
(45) Date of Patent: Mar. 22, 2022

(54) IMAGE PICKUP DEVICE AND STORAGE MEDIUM

(71) Applicant: CANON KABUSHIKI KAISHA, Tokyo (JP)

(72) Inventors: Yusuke Yamashita, Kanagawa (JP); Yasuhiro Itoh, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/206,597

(22) Filed: Mar. 19, 2021

(65) Prior Publication Data
US 2021/0306571 A1 Sep. 30, 2021

(30) Foreign Application Priority Data

Mar. 24, 2020 (JP) .............................. JP2020-052491
Feb. 8, 2021 (JP) .............................. JP2021-018551

(51) Int. Cl.
| H04N 5/3745 | (2011.01) |
| H04N 5/235 | (2006.01) |
| H04N 5/243 | (2006.01) |
| H03M 1/18 | (2006.01) |

(52) U.S. Cl.
CPC .............. *H04N 5/243* (2013.01); *H03M 1/18* (2013.01); *H04N 5/2355* (2013.01); *H04N 5/37455* (2013.01)

(58) Field of Classification Search
None
See application file for complete search history.

(56) References Cited

U.S. PATENT DOCUMENTS

| 8,614,748 B2 * | 12/2013 | Ohya ..................... H04N 5/335 348/222.1 |
| 9,264,634 B2 | 2/2016 | Oike et al. |
| 9,445,029 B2 | 9/2016 | Shimizu |
| 10,567,690 B2 * | 2/2020 | Kobayashi ............. H04N 5/378 |

FOREIGN PATENT DOCUMENTS

| JP | 2013-251677 A | 12/2013 |
| JP | 2015-128253 A | 7/2015 |

* cited by examiner

*Primary Examiner* — Mark T Monk
(74) *Attorney, Agent, or Firm* — Cowan, Liebowitz & Latman, P.C.

(57) ABSTRACT

In order to improve linearity characteristics in synthesis processing for expanding a dynamic range, an image pickup apparatus comprising an AD conversion unit for performing AD conversion of input signals by comparing a first ramp signal or a second ramp signal; a first synthesis unit for synthesizing a first signal AD converted using the first ramp signal and a second signal AD converted using the second ramp signal; a first correction unit for correcting a level difference between the first signal and the second signal when the first signal and the second signal are synthesized; an amplifier for amplifying pixel signals by different gains; a second synthesis unit for synthesizing the signals amplified by the different gains; and a second correction unit for correcting a level difference between the signals amplified by the different gains when the signals amplified by the different gains are synthesized.

9 Claims, 12 Drawing Sheets

IMAGE PICKUP DEVICE AND STORAGE MEDIUM

BACKGROUND

Field of the Invention

The present disclosure relates to, for example, an image pickup apparatus suitable for a digital camera and the like.

Description of the Related Art

In recent years, the television standard has been evolving from a Full High Vision, which has 1,920 horizontal pixels and 1,080 vertical pixels (hereinafter, referred to as "1920× 1080") to, so called, a 4K2K having 3840×2160 pixels, which has four times the number of pixels of the Full High Vision. Additionally, as the next generation beyond 4K2K, there is a standard referred to as "8K4K" or "Super High Vision", which has 7680×4320 pixels. In addition to the increase in the number of pixels, the frame rate continues to increase.

In accordance with such a change, an image pickup apparatus that generates a television image is required to have a high resolution and a high frame rate for an image that can be recorded. In order to satisfy the above requirements, one of the important issues is to increase the speed of readout time of the image signal from an image pickup device that converts light into an electric signal, and in particular, an increase in the speed of the AD converter in the image pickup device is required.

Additionally, not only the increase in speed of the frame rate but also the expansion of a dynamic range are important elements for displaying images. Japanese Patent Application Laid-Open No. 2013-251677 includes a comparison unit that compares an analog signal with a predetermined voltage, selects one of reference voltages having different gradation accuracy, and shortens a time required for AD conversion without reducing gradation.

In Japanese Patent Application Laid-Open No. 2015-128253, a technique is proposed in which signals are read out for one pixel line by a plurality of vertical signal lines, and signals of the same pixel are read out by a plurality of different gains. With the configuration as disclosed in Japanese Patent Application Laid-Open No. 2015-128253, it is possible to produce image signals having a high dynamic range and low noise by outputting image signals of a low gain and a high gain, and synthesizing them in a subsequent image processing circuit.

However, if the linearity characteristics of the two image signals to be synthesized are poor in the expansion of the dynamic range in the image processing, the synthesizing processing cannot be correctly performed. Additionally, in the method disclosed in Japanese Patent Application Laid-Open No. 2013-251677, if the linearity characteristics are deteriorated due to the switching of the reference voltage, the dynamic range expansion by the synthesis is adversely affected. Thus, there is a need in the art to provide an image pickup apparatus that can perform image synthesis processing having high linearity characteristics.

SUMMARY

In order to achieve the object, an image pickup device according to an aspect of the present disclosure includes an AD conversion unit configured to perform AD conversion of input signals by comparing a first ramp signal or a second ramp signal having a different inclination from the first ramp signal; a first synthesis unit configured to synthesize a first signal on which AD conversion has been performed by comparing the first ramp signal and a second signal on which AD conversion has been performed by comparing the second ramp signal; a first correction unit configured to correct a level difference between the first signal and the second signal when the first signal and the second signal are synthesized by the first synthesis unit; an amplifier configured to amplify pixel signals by different gains; a second synthesis unit configured to synthesize the signals that have been amplified by the different gains, and a second correction unit configured to correct a level difference between the signals amplified by the different gains when the signals amplified by the different gains are synthesized by the second synthesis unit.

Further features of the present disclosure will become apparent from the following description of embodiments with reference to the attached drawings.

BRIEF DESCRIPTION OF THE DRAWINGS

12B illustrates the AD conversion of dummy pixels that have been output at a low gain in Embodiment 2.

DESCRIPTION OF THE EMBODIMENTS

Hereinafter, a preferred embodiment of the present disclosure will be described using Embodiments with reference to the accompanying drawings. Meanwhile, in the drawings, the same members or components will be denoted by the same reference numerals and signs, and repeated description will be omitted or simplified. Furthermore, in the Embodiments, an example in which the present disclosure is applied to an image pickup apparatus such as a digital still camera. However, the image pickup apparatus in the present Embodiments includes image processing apparatuses having an imaging function such as a digital movie camera, a smartphone with a camera, a tablet computer with a camera, an on-vehicle camera, a network camera, and so on.

Embodiment 1

Figure 1:
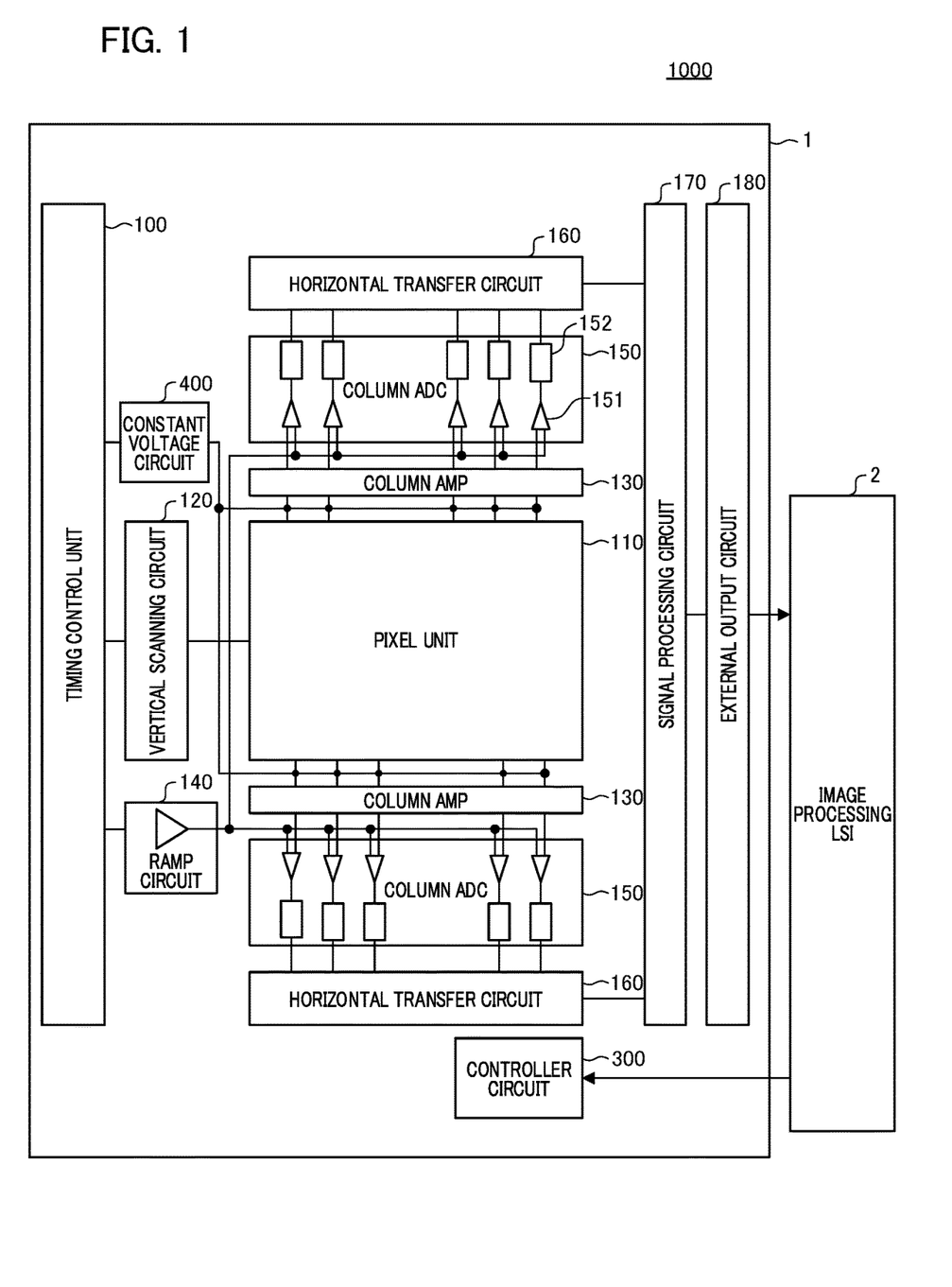
FIG. 1 is a block diagram of an image pickup apparatus according to Embodiment 1.

Embodiment 1 of the present invention will be described below. FIG. 1 is a block diagram of an image pickup apparatus 1000 according to Embodiment 1, and the image pickup apparatus 1000 has an image pickup device 1 (such as a CMOS image sensor) in which parallel type AD converters are provided, and an image processing LSI 2. The image processing LSI 2 performs processing such as white balance processing, gamma processing, HDR synthesis processing, and processing for correcting a ratio of two-pixel signals having different gains, to be described below, on image data output from the image pickup device 1, and finally records the image data on a recording medium.

Additionally, the image processing LSI 2 includes a CPU serving as a computer, and performs communication with the image pickup device 1 (for example, serial communication) and the like by using the CPU based on a computer program stored in a memory to control the entire image pickup apparatus 1000. The image pickup device 1 has, for example, the pixel unit 110, a vertical scanning circuit 120, a column amplifier (column AMP) 130, a ramp circuit 140, a column ADC (Analog To Digital Converter) 150, a horizontal transfer circuit 160, a signal processing circuit 170, an external output circuit 180, and a controller circuit 300.

The controller circuit 300 includes as an I/F unit with the image processing LSI 2, and receives a control signal from the CPU of the image processing LSI 2 by using a serial communication and the like to control each circuit in the image pickup device 1. In the pixel unit 110, a plurality of pixels, each having a photoelectric conversion element (photodiode) that performs photoelectric conversion in accordance with an amount of incident light and outputs a voltage signal, is arranged in a two-dimensional manner. A color filter and a micro lens are mounted on the surface of each photoelectric conversion element.

Although three color filters of R (red), G (green), and B (blue) are periodically arranged as Bayer array in this embodiment, and each color filter is arranged on each photoelectric conversion element, the present invention is not limited to this embodiment. A timing control unit 100 supplies an operation clock CLK or a timing signal to each block of this image pickup device to control the operation of each block. The vertical scanning circuit 120 performs control for sequentially reading out the output signals of each pixel arranged in a two-dimensional manner in the pixel unit 110 line by line in one frame period. That is, the image signals are sequentially read out line by line from the upper line to the lower line in the pixel unit 110, in one frame period.

The column amplifier 130 is arranged in each column for electrically amplifying the image signals read out from the pixel unit 110 and includes an operational amplifier to be described below. The image signals are amplified by the column amplifier 130 to equivalently improve the S/N ratio regarding a noise generated by the column ADC 150 subsequently provided in each column.

Note that in FIG. 1, for example, the output signals of pixels in odd-numbered columns of the pixel unit 110 are amplified and read out by the column amplifier 130 on the upper side of the pixel unit 110, and the signals of pixels in even-numbered columns are amplified and read out by the column amplifier 130 on the lower side of the pixel unit 110. The gain of the column amplifier 130 can be changed by the control signals from the timing control unit 100.

A constant voltage circuit 400 can supply predetermined voltages to each of column signal output lines before inputting the output signals of each pixel to the column amplifier 130. Note that instead of the constant voltage circuit 400, a clip circuit that clips the signals at a predetermined constant voltage may be used. The ramp circuit 140 is a signal generator for generating a ramp shape voltage signal (ramp signal) in which the voltage changes at a constant slope with the passage of time.

The column ADC 150 has, for each column, a comparison unit 151 that compares the signals amplified by the column amplifier 130 with the ramp signals supplied from the ramp circuit 140, and a counter latch circuit 152 that counts a time until the voltage level of the signal amplified by the column amplifier 130 matches the voltage level of the ramp signal and holds the count value. As will be described below, the column ADC 150 performs AD conversion of a first image signal and a second image signal amplified by different gains in the column amplifier 130, and performs AD conversion of a first noise signal and a second noise signal amplified by different gains in the column amplifier 130.

The count values of each column for one line held in the counter latch circuit 152 are sequentially read out as AD-converted image data, from the rightmost column by the horizontal transfer circuit 160. The image data that have been output from the horizontal transfer circuit 160 are input to the signal processing circuit 170. The signal processing circuit 170 is a circuit that digitally performs signal processing such as adding a fixed amount of offset value or digital gain control by a shift calculation or a multiplication.

Additionally, by providing a light-shielded pixel region (optical black region) in the pixel unit 110, a digital black level clamping operation using an output signal from the optical black region may be performed. The image data that have been output from the signal processing circuit 170 are supplied to an external output circuit 180. The external output circuit 180 has a serializer function and converts a multi-bit parallel signal input from the signal processing circuit 170 into a serial signal. Additionally, this serial signal is converted into, for example, a signal conforming to the LVDS (Low Voltage Differential Signaling) standard, and is output to an external device (in the present embodiment, the image processing LSI 2) to serve as image data.

Figure 2A:
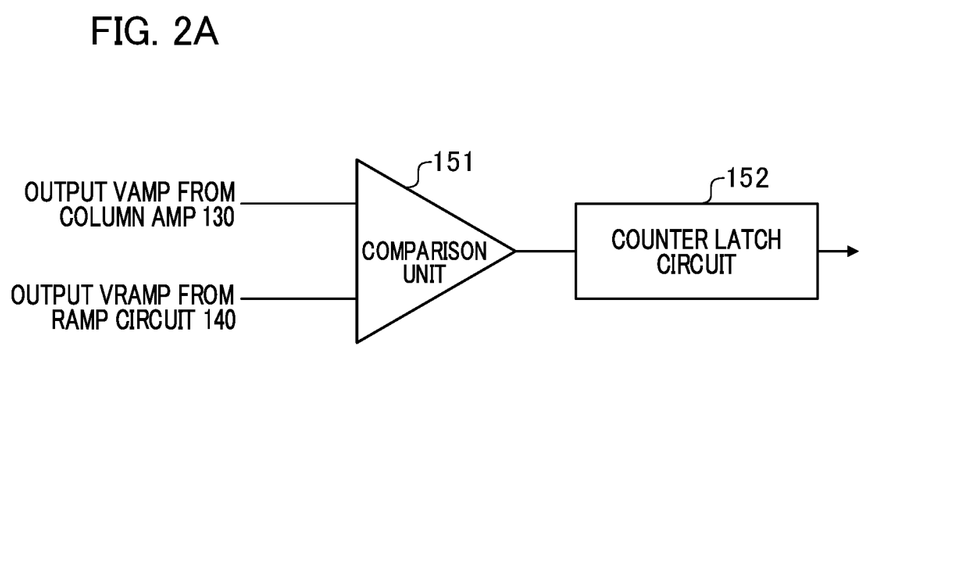
FIG. 2A illustrates a block diagram of an AD conversion unit in an image pickup device of Embodiment 1.
Figure 2B:
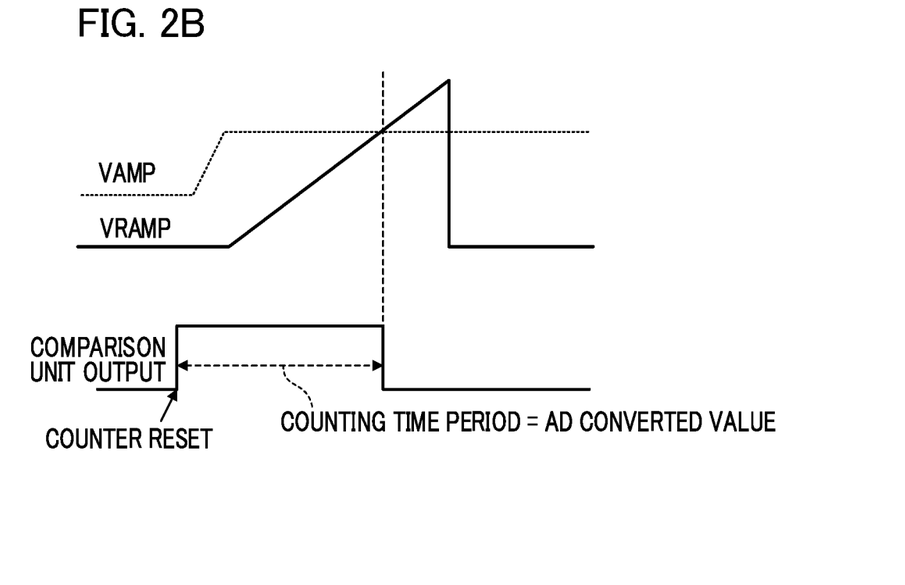
FIG. 2B illustrates an operation of the AD conversion unit.

Next, AD conversion by using the column ADC 150 of the image pickup device 1 will be described with reference to FIGS. 2A and 2B. FIG. 2A illustrates a block diagram of the comparison unit 151 in the image pickup device 1 of Embodiment 1. The column ADC 150 has the comparison unit 151 and the counter latch circuit 152 therein, and the comparison unit 151 compares a signal VAMP amplified by the column amplifier 130 with a ramp signal VRAMP supplied from the ramp circuit 140, and outputs a comparison result.

The counter latch circuit 152 performs a counting operation for a time period from resetting the count value until the voltage level of the signal amplified by the column amplifier 130 matches the voltage level of the ramp signal and the comparison output of the comparison unit 151 is inverted. By this operation, a count value proportional to the signal level from the column amplifier 130 can be obtained, and this count value becomes an AD conversion result. FIG. 2B illustrates an operation of the AD conversion unit.

By changing a slope (an inclination) at which a voltage changes with the passage of time, the timing at which the comparison output of the comparison unit is inverted changes, so that the count value changes in accordance with the count time. Thus, the digital gain of the AD converter can be changed. For example, if the slope at which the voltage changes is made gentle, the count value increases. In other words, the AD conversion gain increases. Note that in this context, the column ADC 150 functions as an AD conversion unit that performs AD conversion of an input signal by comparing a first ramp signal VRAMP1 or a second ramp signals VRAMP2 having a different inclination from the first ramp signal.

Figure 3:
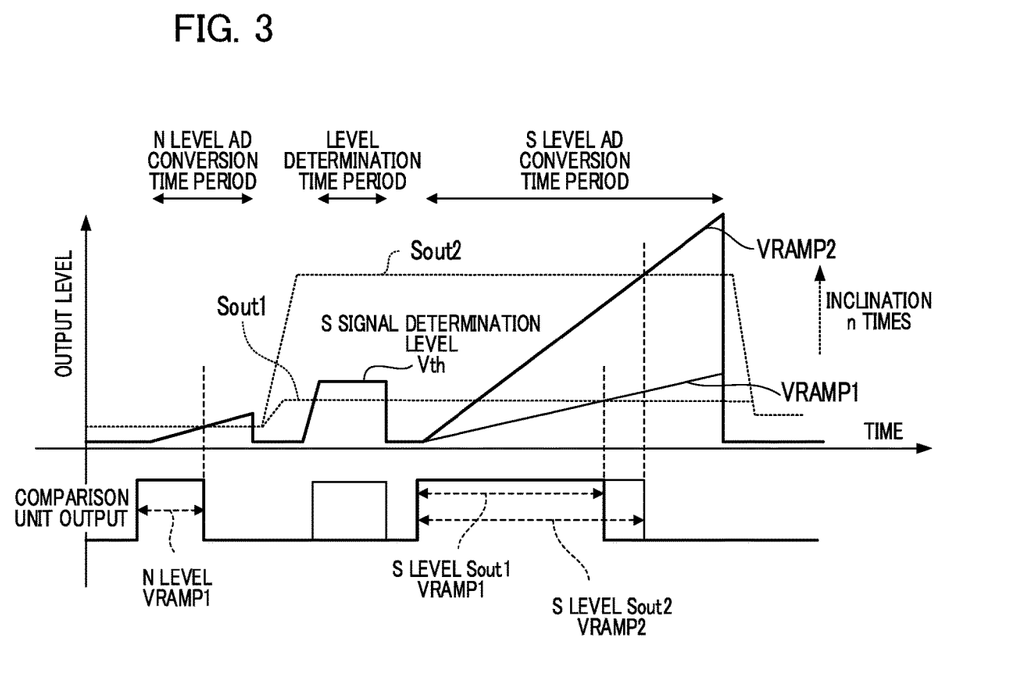
FIG. 3 illustrates an operation of AD conversion by a plurality of slopes according to Embodiment 1.

FIG. 3 illustrates an operation of AD conversion by a plurality of ramp signals having different slopes from each other in Embodiment 1, and illustrates the operation timing of the column ADC 150, wherein the horizontal axis represents time. An example in which the slope of the ramp signals VRAMP from the ramp circuit 140 is changed in accordance with the voltage level of the output signal of the column amplifier 130 will be described with reference to FIG. 3.

In the present embodiment, when AD conversion of the output signals for each pixel is performed, first, an N signal (noise) is read out from each pixel and is AD converted, and subsequently an S signals (noise+photoelectric conversion signal) is read out from each pixel and is AD converted. With respect to these two digital signals, the signal processing circuit 170 performs subtraction processing for subtracting the N signal from the S signal to cancel a noise component in order to obtain a signal having a high S/N ratio.

First, in the AD conversion time period of the N signal, the N signal accumulated in each pixel of the pixel unit 110 is read out to be amplified by the column amplifier 130. The ramp circuit 140 outputs the first ramp signals VRAMP1 having a relatively gentle inclination to the comparison unit 151, and the counter latch circuit 152 performs a counting operation based on the comparison result between the first ramp signal VRAMP1 and the N signal. Since the voltage level of the N signal is smaller than that of the S signal, A/D conversion is performed by using the first ramp signal having a relatively small inclination. That is, the AD conversion gain is increased.

Next, in a level determination time period, the S signal accumulated in each pixel of the pixel unit 110 is read out and amplified by the column amplifier 130. The ramp circuit 140 outputs a predetermined determination level Vth to a comparison unit 151 and compares the determination level Vth with the S signal. The counter latch circuit 152 receives the result and determines whether the S signal is larger or smaller than the determination level Vth.

When the S signal is smaller than the determination level Vth (Sout1 in FIG. 3), it is determined that the luminance of an object is appropriate (normal). Subsequently, the ramp circuit 140 outputs the first ramp signal VRAMP1 that is the same as that used for the N signal to the comparison unit 151 and the counter latch circuit 152 performs a counting operation based on the comparison between the first ramp signal VRAMP1 and the S signal to perform AD conversion. That is, the AD conversion gain is kept high. When the S signal is larger than the determination level Vth (Sout2 in FIG. 3), it is determined that the luminance of the object is high. Subsequently, the ramp circuit 140 outputs the second ramp signals VRAMP2 having a slope that is n times larger than the first ramp signal to the comparison unit 151, and the counter latch circuit 152 performs a counting operation based on the comparison between the second ramp signal VRAMP2 and the S signal to perform AD conversion. That is, the AD conversion gain is low.

Figure 4A:
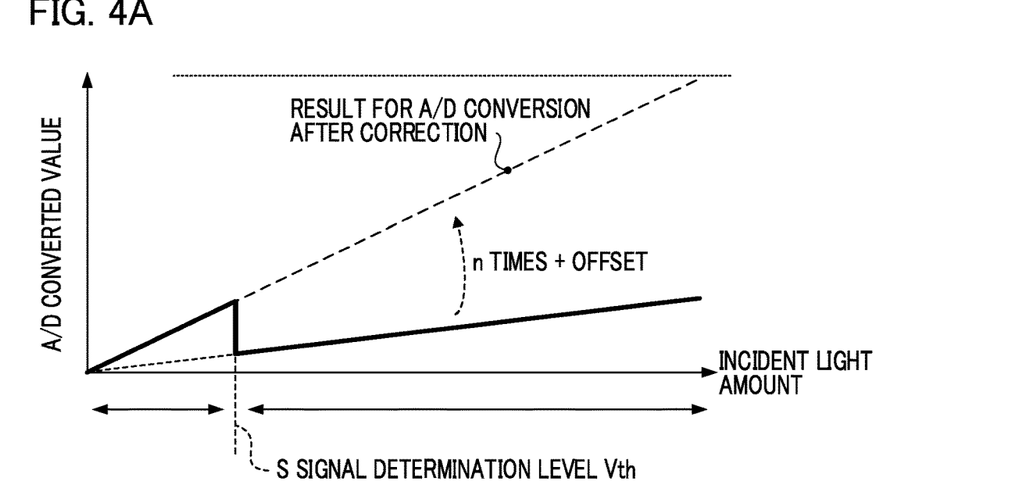
FIG. 4A is a diagram illustrating the correction of the result for the AD conversion by the slopes of Embodiment 1.
Figure 4B:
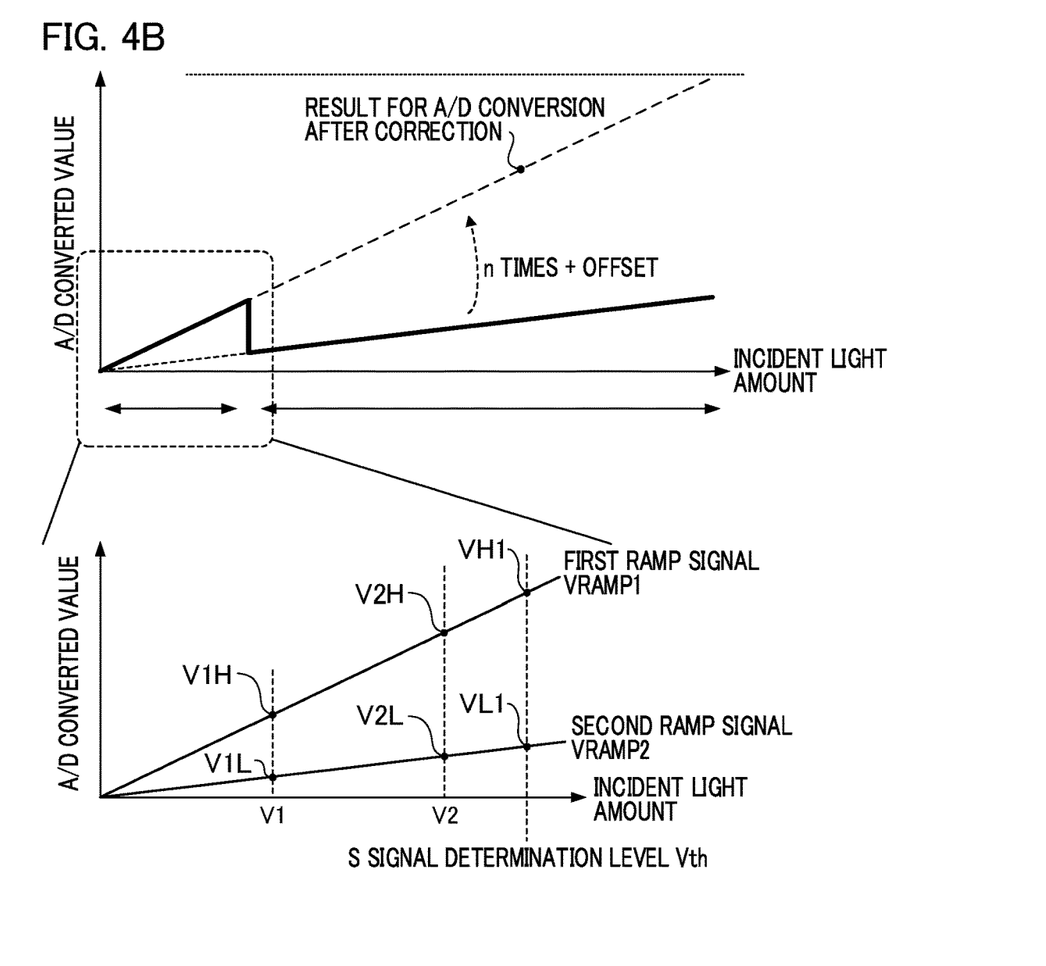
FIG. 4B is an enlarged view of a part of FIG. 4A.

FIG. 4A is a diagram illustrating the correction of the result for the AD conversion by the slopes of Embodiment 1, and FIG. 4B is an enlarged view of a part of FIG. 4A. In FIGS. 4A and 4B, the horizontal axis represents an amount of incident light to the pixel unit 110 or the output of the column amplifier 130, and the vertical axis represents a digital value of the S signal after AD conversion. Note that the signal processing circuit 170, as a first synthesis unit, synthesizes a first signal obtained by AD conversion with the first ramp signal and a second signal obtained by AD conversion with the second ramp signal by a method as shown in FIG. 4A.

The solid line in the drawing represents a digital value of the image data that is obtained by AD conversion performed by the comparison unit 151 and the counter latch circuit 152, passing through the horizontal transfer circuit 160, and being input to the signal processing circuit 170. Since the S signal smaller than the determination level Vth for the S signals is AD converted with the first ramp signal VRAMP1 and the S signal larger than the determination level Vth is AD converted with the second ramp signal VRAMP2, a level difference of the AD converted values of the S signals occurs at the determination level Vth.

Accordingly, in the present embodiment, for example, in the signal processing circuit 170, the S signal larger than the determination level Vth is multiplied by a ratio n between the inclinations of the first and the second ramp signals. Furthermore, a predetermined offset is added so that no level difference occurs at the determination level Vth. Thus, a relation between the amount of incident light and the AD converted value become a straight line. Specifically, in the present embodiment, a correction on a ratio between the inclinations of the first and the second ramp signals and an offset correction are performed on the signals on which AD conversion has been performed by the first ramp signal or the second ramp signal, and consequently a level difference between the first signal and the second signal at a junction where the first signal and the second signal are connected by synthesizing is accurately corrected.

If the image signals of an effective pixel are output without performing correction as in the present embodiment, a level difference may occur in the image signal level at a certain luminance, and consequently an image having a strange appearance may occur. On the contrary, according to the present embodiment, such a drawback can be properly suppressed. Since the level difference between the first signal and the second signal varies depending on the temperature of the image pickup device, the driving timing of the image pickup device (for example, a gain and an operating state of the column amplifier 130), or the driving settings (for example, power settings), a correction value is periodically obtained in the present embodiment. Next, an example of a method for calculating correction values such as a multiplication factor n for correcting a ratio between the inclinations of the first and the second ramp signals and the offset value to be added in the present embodiment will be described.

Figure 5:
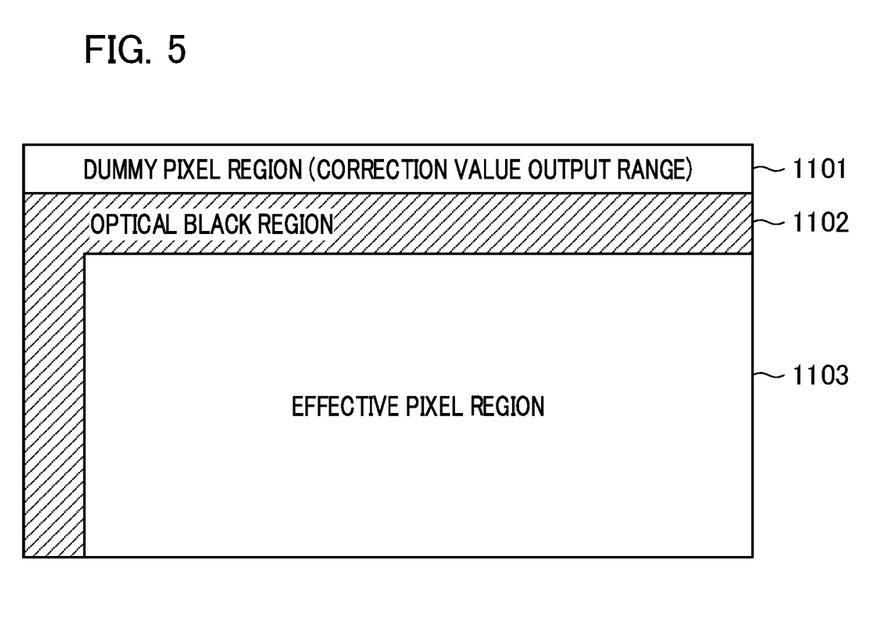
FIG. 5 is a schematic front view of a pixel unit 110 of Embodiment 1.

FIG. 5 illustrates a schematic front view of the pixel unit 110. As a pixel configuration, a dummy pixel region (correction value output region) 1101 is disposed at the uppermost part in FIG. 5, an optical black region 1102 is arranged at the lower part thereof, and an effective pixel region 1103 for obtaining an actual image signal is disposed at the further lower part thereof. In the present embodiment, the dummy pixel region 1101 is used for calculating the multiplication factor n for correcting a ratio between the inclinations of the first and the second ramp signals and the offset value.

The pixels in the dummy pixel region 1101 do not have photodiodes, which is different from the other pixels, although the output terminal of the dummy pixel is connected to the input of the column amplifier 130. During the readout time period of the output signals of the dummy pixels, one of fixed voltages from the constant voltage circuit 400 is input to the column amplifier 130. Hence, the voltage input from the column amplifier 130 to the comparison unit 151 is fixed at one of predetermined voltages (in the present embodiment, voltage V1 or voltage V2). Next, AD conversion during the readout time period of the output signals of the dummy pixel region will be described with reference to FIGS. 6A to 6D. FIGS. 6A to 6D illustrate AD conversion operations of the output signals for the dummy pixel of Embodiment 1.

Figure 6A:
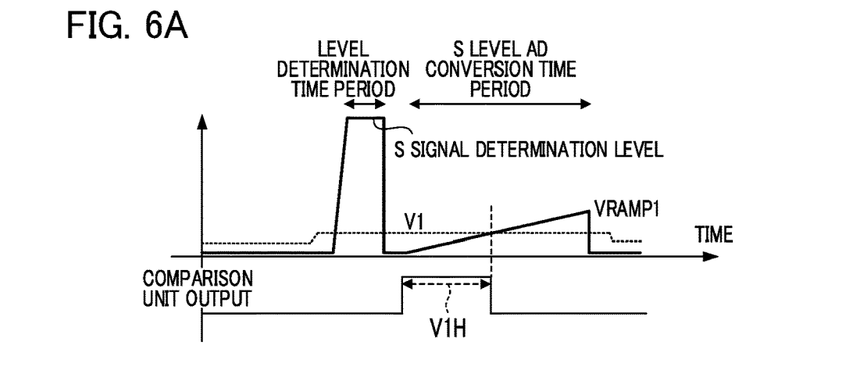
FIG. 6A illustrates an operation of the AD conversion of a voltage V1 for a dummy pixel of Embodiment 1, in which a VRAMP in a level determination time period is set to a predetermined maximum value.
Figure 6B:
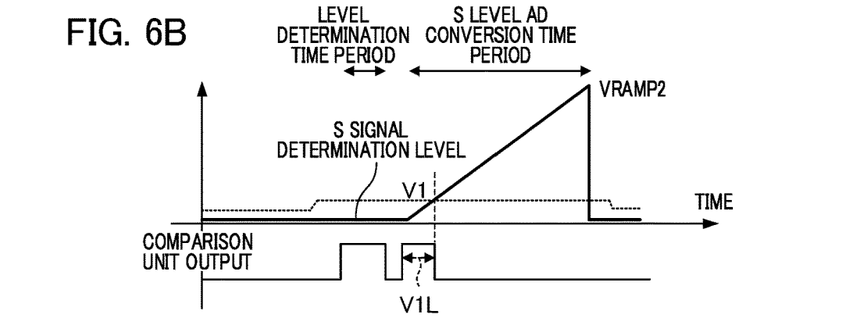
FIG. 6B illustrates the operation of the AD conversion of the voltage V1 for the dummy pixel of Embodiment 1, in which the VRAMP in the level determination time period is set to a predetermined minimum value.

In FIGS. 6A and 6B, during readout of the output signals of the dummy pixel region 1101, the voltage V1 is input to the column amplifier 130 to perform AD conversion. Unlike FIG. 3, it is not necessary to provide an AD conversion time period for the N signals. In FIG. 6A, the VRAMP in the level determination time period is set to a predetermined maximum value so that the input signal level is made smaller than the determination level. Thus, AD conversion of the voltage V1 is performed with the first ramp signals VRAMP1 having a gentle inclination (that is, a large AD conversion gain). The result of AD conversion is denoted by "V1H".

Figure 6C:
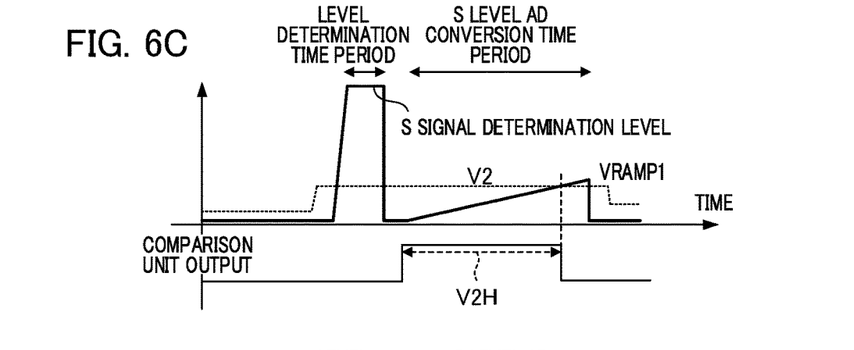
FIG. 6C illustrates the operation of the AD conversion of a voltage V2 from the dummy pixel of Embodiment 1, in which the VRAMP in the level determination time period is set to the predetermined maximum value.
Figure 6D:
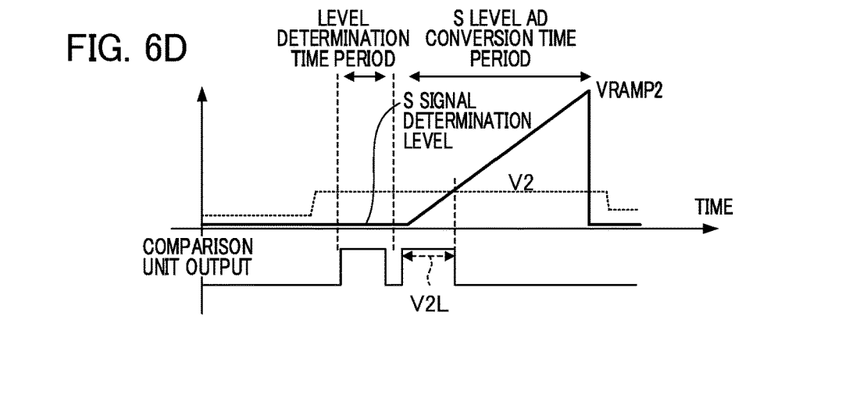
FIG. 6D illustrates the operation of the AD conversion of the voltage V2 from the dummy pixel of Embodiment 1, in which the VRAMP in the level determination time period is set to the predetermined minimum value.

Subsequently, in FIG. 6B, the VRAMP in the level determination time period is set to a predetermined minimum value so that the input signal level is made larger than the determination level. Thus, AD conversion of the voltage V1 is performed with the second ramp signals VRAMP2 having a large inclination (that is, a small AD conversion gain). The result of AD conversion is denoted by "V1L". In FIGS. 6C and 6D, the fixed voltage is changed to voltage V2, and AD conversions are performed thereto in a manner that is the same as the AD conversions in FIGS. 6A and 6B. The results are denoted by "V2H" and "V2L".

These are illustrated in FIG. 4B, where the horizontal axis represents an amount of incident light and the vertical axis represents an AD converted value. FIG. 4B is an enlarged view of a portion smaller than the determination level Vth shown in FIG. 4A. As described above, in the output readout time period of the dummy pixel region 1101, the fixed voltages V1 and V2 are input, and the AD converted values by the first ramp signal and the second ramp signal for the respective fixed voltages are obtained.

The multiplication factor n for correcting a ratio between the inclinations of the first and the second ramp signals as the result of the AD conversion is obtained from the coordinates of these four points (V1L, V1H, V2L, and V2H) based on the actual result of the AD conversion by the first ramp signal VAMP1 and the actual result of the AD conversion by the second ramp signal VAMP2. Furthermore, an actual level difference (offset value) in Vth is obtained. For example, the multiplication factor n is obtained by the following formula (1):

$$n = (V2H - V1H)/(V2L - V1L) \tag{1}$$

After obtaining the inclination ratio n, the value obtained by the line connecting V2L and V1L at the determination level Vth is calculated and denoted by "VL1", and VL1 is multiplied by the ratio n to obtain nVL1. In addition, a value obtained by a line connecting V2H and V1H at the determination level Vth is calculated and denoted by VH1, so that the offset value α satisfying the following formula (2) can be obtained.

$$\alpha = VH1 - nVL1 \tag{2}$$

Note that in FIG. 6B and FIG. 4B, since only two types of voltages V1 and V2 are used upon readout of the output signals of the dummy pixel, in FIG. 4B, each of the line connecting V2L and V1L and the line connecting V2H and V1H becomes a straight lines, so that α=0 is obtained in the above formula (2), however, each of the lines is not always a straight line when three or more types of voltages are used during readout of the output signals of the dummy pixels, and in that case, an offset value α other than 0 is obtained. By using the offset value α, correction with higher accuracy can be performed.

The above calculation may be performed by a circuit inside the image pickup device or may be performed by, for example, the image processing LSI 2, wherein the circuit that performs the above calculation can function as a first correction unit that corrects a level difference between the first signal and the second signal when the first signal and the second signal are synthesized by the first synthesis unit.

Figure 7:
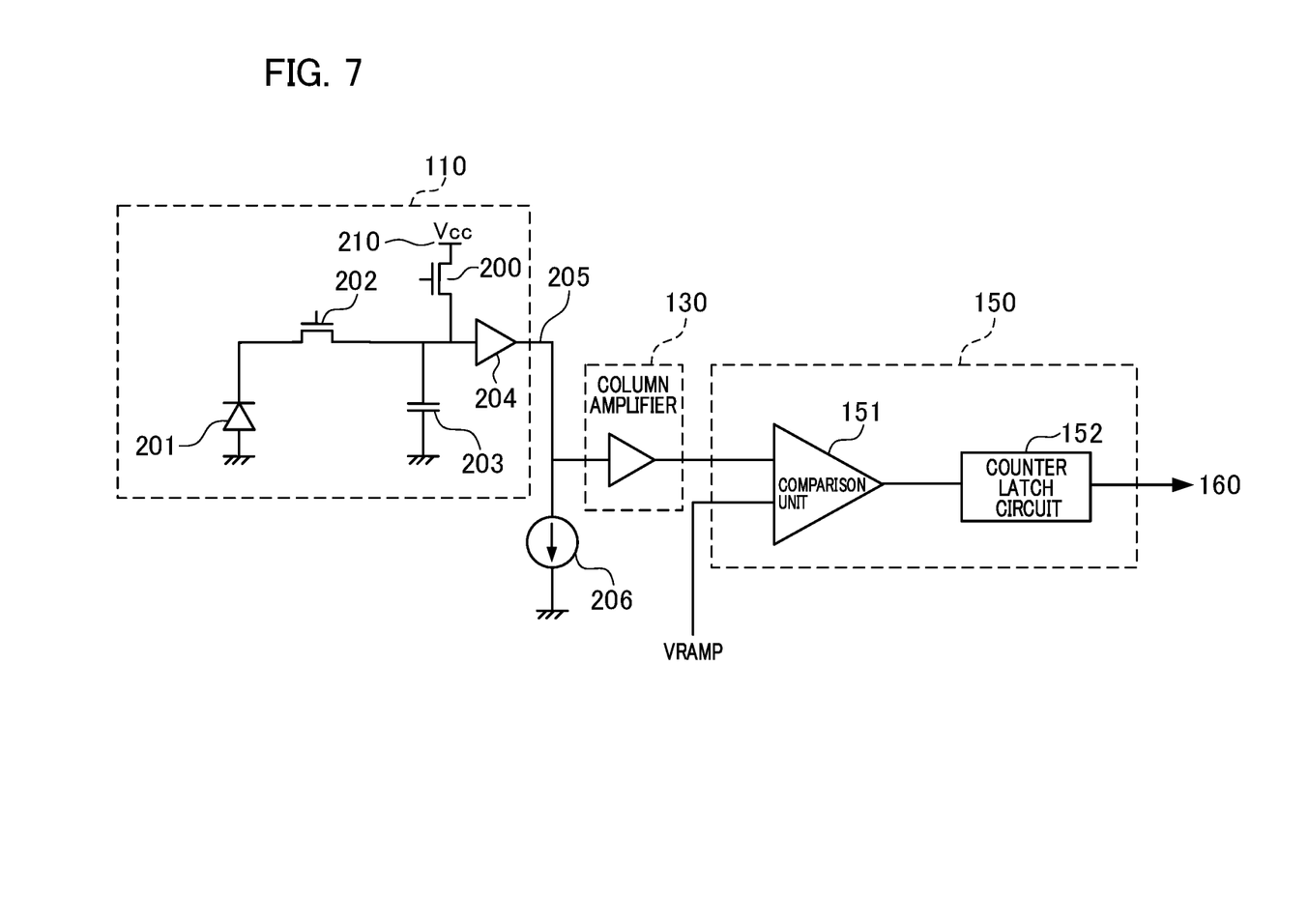
FIG. 7 is a block diagram of a part of the image pickup device of Embodiment 1.

FIG. 7 is a block diagram of a part of the image pickup device of Embodiment 1. Signal processing from the pixel unit 110 to the horizontal transfer circuit 160 will be described with reference to FIG. 7. A photoelectric conversion element (photodiode) 201 receives light through a micro lens (not illustrated), and converts the light into electric charges by photoelectric conversion. A transfer switch 202 transfers the electric charges generated in the photoelectric conversion element 201 to a charge holding unit 203 in a subsequent stage.

The charge holding unit 203 temporarily holds the charges generated in the photoelectric conversion element 201. A reset MOS transistor 200 resets the charges of the charge holding unit 203 and so on, wherein a source of the reset MOS transistor 200 is connected to the charge holding unit 203, and a drain of the reset MOS transistor 200 is connected to a power supply voltage Vcc.

The pixel amplifier 204 amplifies the signals of the charge holding unit 203, and outputs the amplified signals to the column amplifier 130, which functions as an analog variable gain amplifier, in a subsequent stage via a signal output line 205. A constant current source 206 supplies a constant current to the signal output line 205. The signals amplified by the column amplifier 130 are output to the horizontal transfer circuit 160 via the column ADC 150.

Figure 8:
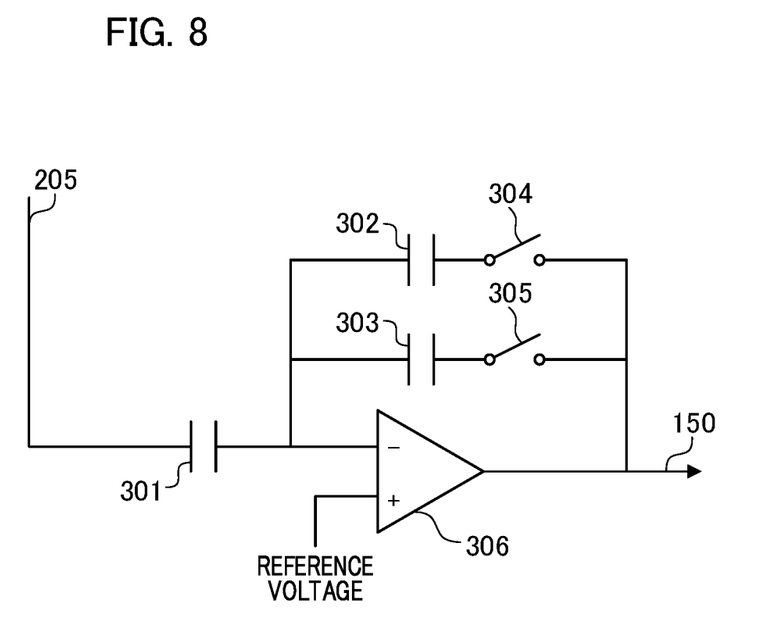
FIG. 8 is a block diagram illustrating a configuration of the inside of a column amplifier of Embodiment 1.
Figure 10A:
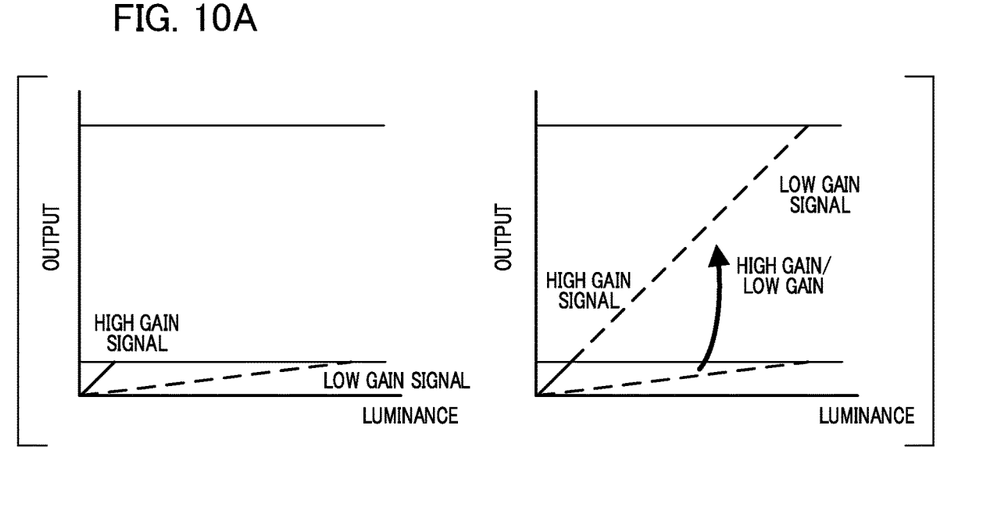
FIG. 10A illustrates the theoretical linearity in the dynamic range expansion synthesis of Embodiment 1.
Figure 10B:
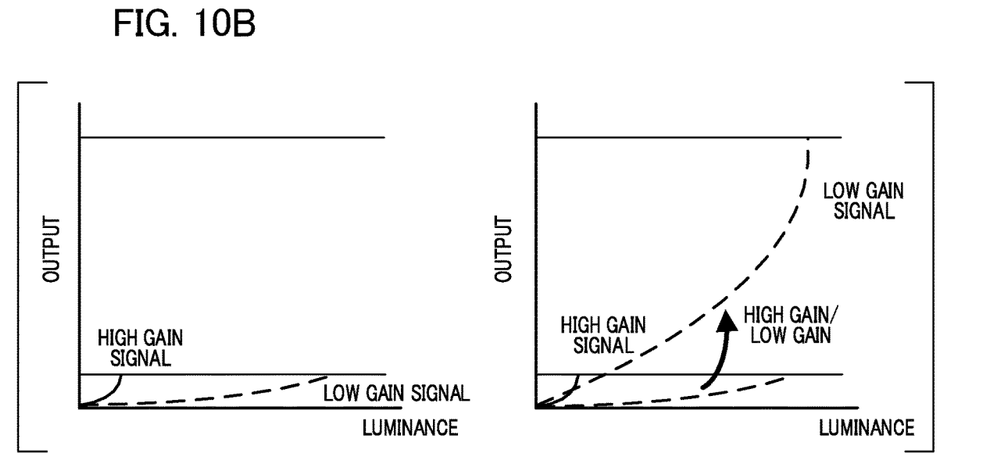
FIG. 10B illustrates a case in which there is a deterioration in linearity.

FIG. 8 is a block diagram illustrating a configuration of the inside of the column amplifier 130. A method for reading out the output signals of each pixel for expanding the dynamic range will be described with reference to FIG. 8. In the present embodiment, the dynamic range is expanded by synthesizing two image signals amplified by different gains in the signal processing in a subsequent stage so that an image signal with a high gain is used for the image of the low luminance part and an image signal having a low gain is used for the image of the high luminance part. This will be described below with reference to FIG. 10.

The column amplifier 130 is configured as an inverting amplifier circuit comprising an operational amplifier 306, an input side capacitor 301, and feedback capacitors 302 and 303. A gain can be changed by switches 304 and 305. First, for example, in a case of reading out the pixel signals with a high gain for an image of proper exposure (low-intensity part), the pixel signals with high-gain GainH can be obtained by turning off the switch 304 and turning on the switch 305.

Next, in a case of obtaining the pixel signals with a low gain for an image of a high luminance part, both switches 304 and 305 are turned on when reading out the pixel signals with low-gain GainL. This way, the total feedback capacitance of the operational amplifier 306 is changed by switching the connection of the capacitors by the switches 304 and 305, so that the pixel signals can be read out with different gains (GainH, GainL). Note that here, the column amplifier 130, which is an analog amplifier, amplifies the pixel signals at a different gain and outputs the signals.

Figure 9:
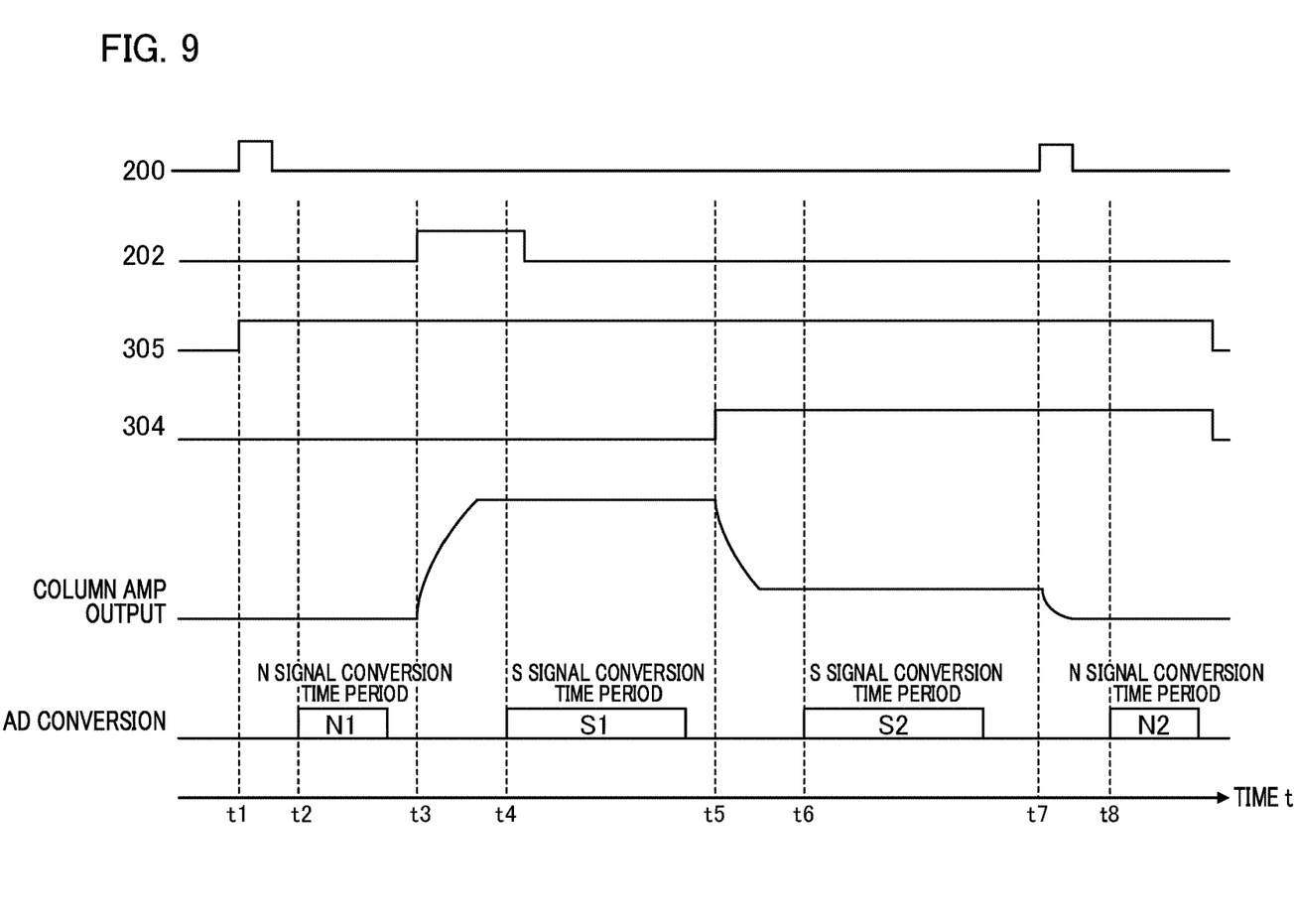
FIG. 9 illustrates the pixel signal readout drive timing of Embodiment 1.

FIG. 9 illustrates the pixel signal readout driving timing according to Embodiment 1 of the present invention. A readout operation of the pixel signals will be described with reference to FIG. 9. First, the switch 304 is turned off, the switch 305 is turned on, so that the gain of the column amplifier 130 is set high (time t1).

In addition, at time t1, the reset MOS transistor 200 is turned on to reset the charge in the pixel. In this state, a noise component (N signal) of the pixel (before turning on the transfer switch 202 of the photoelectric conversion element) is read out, and amplified with a high gain GainH by the column amplifier 130. In addition, AD conversion is further performed to obtain an N1 signal with the high gain GainH (time t2).

At time t3, the transfer switch 202 of the photoelectric conversion element is turned on to read out an image signal component (S signal). Subsequently, the S signal that has been read out are amplified with a high gain GainH by the column amplifier 130, and AD conversion is performed on the amplified signal, so that the signal is output as an S1 signal with a high gain GainH (time t4). Next, at time t5, the switch 304 is turned on and the gain of the column amplifier 130 is set low. Subsequently, the S signal that has been read out is amplified with a low gain GainL by the column amplifier 130, and AD conversion is performed on the amplified signal to obtain an S2 signal with a low gain GainL (time t6).

Subsequently, at time t7, the charge in the pixel are reset again by the reset MOS transistor 200, the N signal is read out, amplified with a low gain GainL, and AD conversion is performed on the amplified signal to obtain an N2 signal with a low gain GainL (Time t8). Note that in a circuit in a subsequent stage, subtraction processing of S1−N1 is performed by using the S1 signal and the N1 signal, and the subtraction processing of S2−N2 is performed by using the S2 signal and the N2 signal. Thus, the gain of the column amplifier 130 is changed when the image signals are read out, and image signals having two types of gains (GainH, GainL) for use in dynamic range expansion synthesis can be obtained while keeping the simultaneity of the image signals.

Next, with reference to FIGS. 10A and 10B, a synthesis for expanding dynamic range, for example, performed in the image processing LSI 2 will be described. FIG. 10A illustrates the theoretical linearity in the dynamic range expansion synthesis of Embodiment 1, and FIG. 10B illustrates a case in which there is a deterioration in linearity. Here, the image processing LSI 2 synthesizes, as a second synthesis unit, the image signals that have been amplified by different gains that have been read out from a readout circuit.

In Embodiment 1, the image signals that have been amplified with a high gain GainH by the column amplifier 130 are used for an image of a normal luminance level, and an image signal that has been amplified with a low gain GainL by the column amplifier 130 is used for a high luminance part that is overexposed, and both image signals are combined and synthesized. In the synthesis processing, an a blend (weighted addition) and the like are used to smoothly connect switching parts (junction parts or connection parts) of the images so that the switching parts (junction parts or connection parts) are inconspicuous.

Before the synthesis processing is performed, in the present embodiment, the luminance of the image with the low gain GainL is adjusted to the luminance of the image with the high gain GainH. Since the gains of the column amplifier 130 are known in advance, if the ratio of the gain (GainH/GainL) is multiplied to the low-gain image, it is theoretically possible to correctly perform the synthesis processing (FIG. 10A). Hence, gains of the column amplifier 130 are obtained in advance.

However, in a case where there are manufacturing errors of the column amplifier 130 or the linearity characteristic of the image pickup device 1 itself is originally poor, a level difference is generated at the connection parts of the images in the dynamic range expansion synthesis, and the linearity becomes deteriorated (FIG. 10 B). Accordingly, in the present embodiment, even when the image signals that have been output with different gains (GainH, GainL) of the column amplifier are connected, correction processing for matching the levels of the switching portions of the images is properly performed.

Specifically, in the present embodiment, the level difference correction is performed not only in the connection with different AD conversion gains as shown in FIG. 4, but also in the connection with different analog column amplifier gains. At that time, the level difference correction is performed at least by correcting a ratio of the signals that have been amplified by the different gains. Here, the image processing LSI 2 also functions as a second correction unit for correcting a level difference between the signals amplified by the different gains when the signals amplified by the different gains are synthesized by the second synthesis unit.

Moreover, for example, linearity characteristic (non-linear characteristic) information of the signals that have been amplified by the different gains in the image pickup device 1 as shown in FIG. 10B is acquired by measurement and stored in a memory in advance, and based on this information, the ratio of the signals and the offset are corrected in the image processing LSI 2 so that the level difference becomes inconspicuous. Although the dynamic range expansion synthesis processing in this embodiment has been described above, any synthesis method may be used if the method is for synthesizing two images having different gains. Additionally, the method for correcting linearity is not limited to the present embodiment as far as the level difference at switching portions (connecting portions) of images are corrected.

Figure 11:
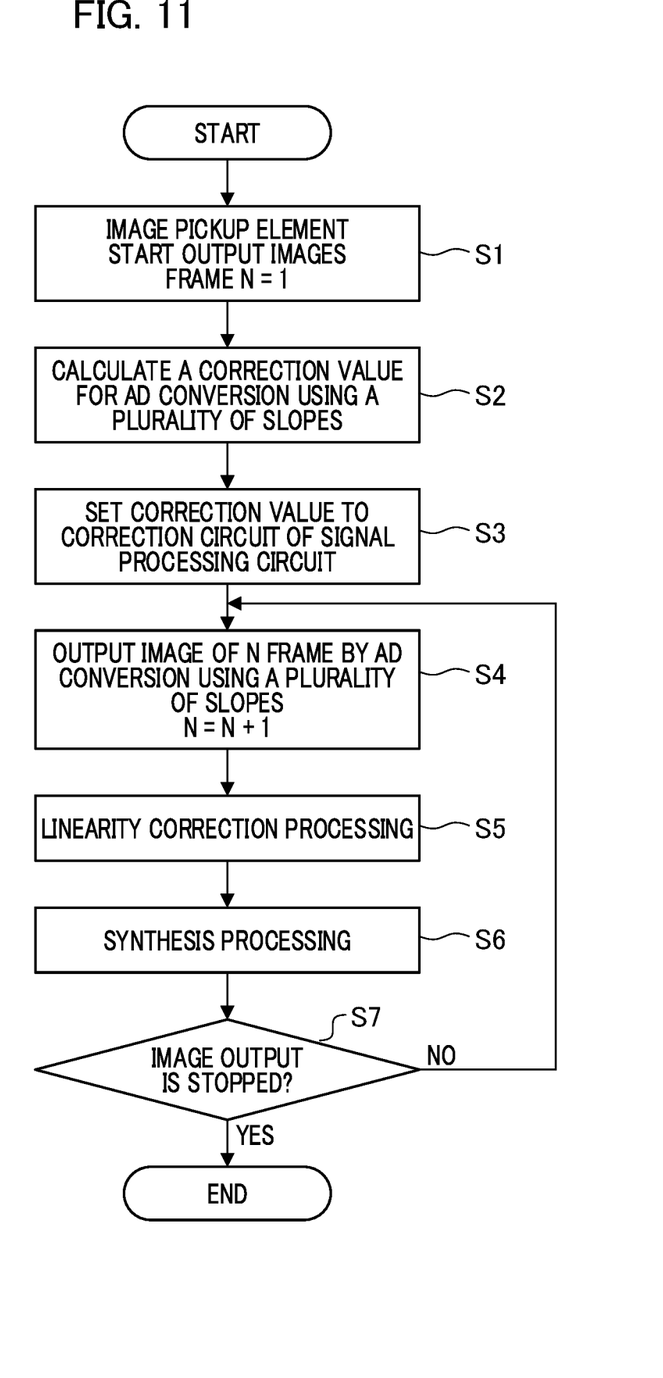
FIG. 11 is a flowchart illustrating a control flow of the image pickup apparatus according to Embodiment 1.

FIG. 11 is a flowchart illustrating a control flow of the image pickup apparatus 1000 according to Embodiment 1. An operation performed, for example, in the image processing LSI 2 according to the embodiment will be described with reference to FIG. 11. The image processing LSI 2 includes a CPU serving as a computer as described above, and the operation shown in FIG. 11 is performed by executing a computer program stored in a memory (not illustrated). In step S1, in a first frame, two images to be amplified by different gains (GainH, GainL) starts to be read out in the image pickup device 1.

When the number of frames is N, the image signals of the first frame are output in step S1, so that N=1 is set. Note that, in each frame, image signals from the dummy pixel region 1101 of FIG. 5 are first read out, and during that period, the fixed voltages V1 and V2 are supplied to the column amplifier 130 as described above. Then, in the column amplifier 130, those voltages V1 and V2 are respectively amplified by one of gains GainH and GainL, and subsequently input to the ADC 150 to be AD converted to digital signals.

In step S2, by using the AD converted signals, correction values (V1L, V1H, V2L, and V2H) are calculated as described with reference to FIG. 4B. In step S3, the multiplication factor n and the offset value are calculated as correction coefficients based on the correction values (V1L, V1H, V2L, and V2H) calculated in step S2, and the correction coefficients are transmitted to the image pickup device 1 and set in a correction circuit in the signal processing circuit 170.

In step S4, the image signals in the second frame (N=N+1) are read out in a state in which the correction coefficients are set. Specifically, the N signal and the S signal of each pixel in the effective pixel region 1103 of FIG. 5 are read out while changing the gains (GainH, GainL) of the column amplifier 130 at the timings as shown in FIG. 9. In addition, calculations of S-N signals, which are (S1-N1) signal and (S2 -N2) signal, are also performed. Subsequently, each of the (S1-N1) signal and (S2-N2) signal are AD converted as shown in FIGS. 3 and 4, so that the AD conversion using the first ramp signals VRAMP1 is performed on each of the S-N signals having a voltage level lower than the determination level Vth, and the AD conversion using the second ramp signals VRAMP2 is performed on each of the S-N signals having a voltage level higher than Vth. This operation is sequentially repeated for each line.

In step S5, the linearity correction processing is performed for synthesizing a part of digital (S1-N1) signal AD converted with the first ramp signal VRAMP1 and another part of digital (S1-N1) signal AD converted with the second ramp signal VRAMP2, based on the multiplication factor n and the offset value obtained in step S 2. Similarly, the linearity correction processing is performed for synthesizing a part of digital (S2-N2) signal AD converted with the first ramp signal VRAMP1 and another part of digital (S2-N2) signal AD converted with and the second ramp signal VRAMP2, based on the multiplication factor n and the offset value obtained in step S 2. By performing such linearity correction processing, it is possible to make the level differences in the connection point of the synthesized digital (S1-N1) signal and the level difference in the connection point of the synthesized digital (S2-N2) signal inconspicuous. Thus, the linearity correction processing and the synthesize processing are performed for each of the digital (S1-N1) signal corresponding to the high gain GainH and the digital (S2-N2) signal corresponding to the low gain GainL.

In step S6, the dynamic range expansion synthesis processing is performed by combining the digital (S1-N1) signal corresponding to the high gain GainH and the digital (S2-N2) signal corresponding to the low gain GainL, as shown in FIG. 10. In this embodiment, the linearity characteristics of the image signals that have been amplified and output by different gains (GainH, GainL) in the image pickup device 1 has been acquired in advance and stored in the memory to serve as the linearity characteristic information. Based on the linearity characteristic information stored in the memory, the level difference of the connection point in the dynamic range expansion synthesis as shown in FIG. 10 is corrected.

In step S7, steps S4 to S7 are repeated until it is determined that the output of the image signals is stopped, such as a case in which a recording switch is turned off or the power of the imaging apparatus is turned off. If it is determined in step S7 that the output of the image is stopped, the flow ends.

Embodiment 2

In Embodiment 1, the linearity characteristic information of the image signals that have been output by different gains (GainH, GainL) as described above is stored in the memory in advance, so that the level difference of the connection in the dynamic range expansion synthesis is corrected based on the linearity characteristic information stored in the memory. However, there is a possibility that the linearity characteristics change depending on the temperature of the image pickup device, the deterioration of the image pickup device due to aging, and so on. Accordingly, in Embodiment 2, the correction value is obtained in real time.

Figure 12A:
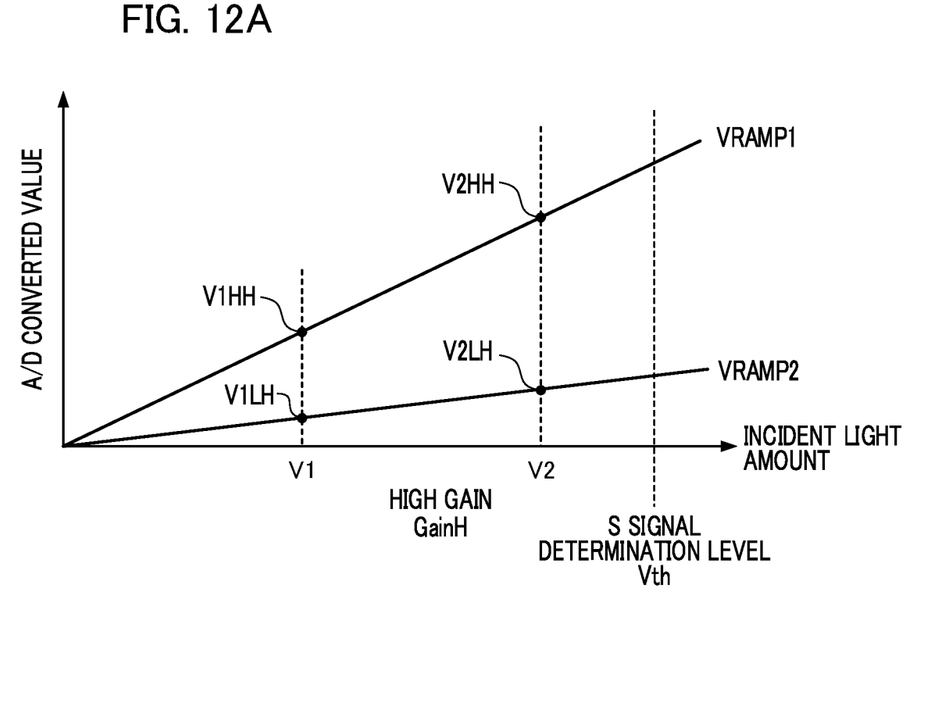
FIG. 12A illustrates AD conversion of dummy pixels that have been output at a high gain in Embodiment 2, and FIG.
Figure 12B:
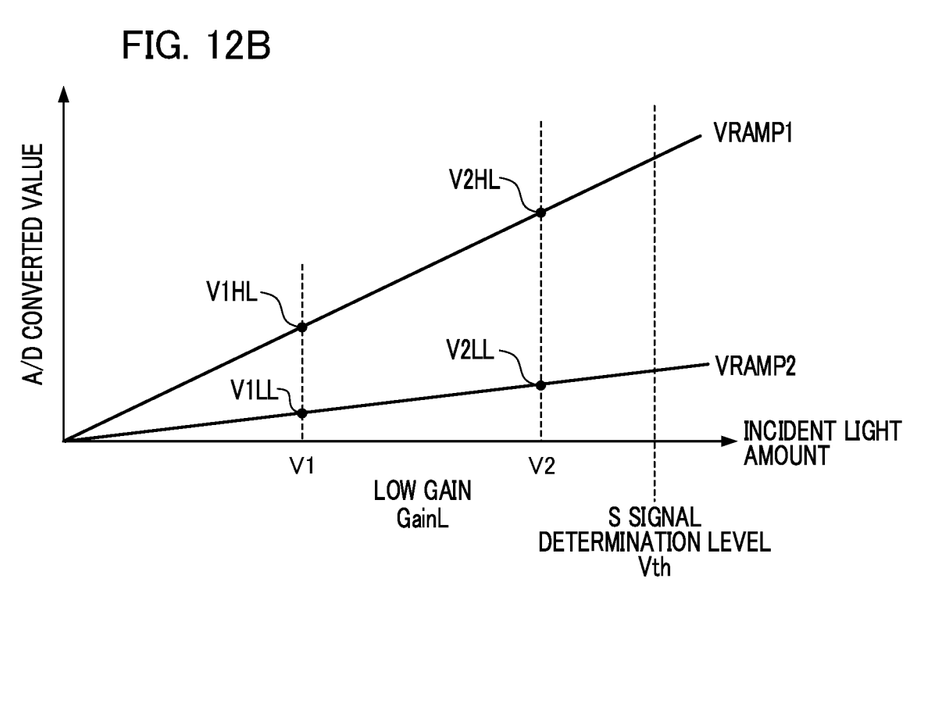

FIG. 12A illustrates AD conversion of dummy pixels that have been output at a high gain in Embodiment 2, and FIG. 12B illustrates the AD conversion of dummy pixels that have been output at a low gain in Embodiment 2. In FIG. 12A, the output signals corresponding to the dummy pixel, which are the voltages V1 and V2, are respectively amplified by the high gain GainH in the column amplifier 130, and AD conversion is performed using the first ramp signals VRAMP1 and the second ramp signal VRAMP2, so that V1HH, V2HH, V1LH, and V2LH are obtained. V1HH corresponds to the voltage V1 amplified by the high gain GainH and AD converted by the ramp signal VRAMP1, V2HH corresponds to the voltage V2 amplified by the high gain GainH and AD converted by the ramp signal VRAMP1, V1LH corresponds to the voltage V1 amplified by the high gain GainH and AD converted by the ramp signal VRAMP2, and V2LH corresponds to the voltage V2 amplified by the high gain GainH and AD converted by the ramp signal VRAMP2.

In FIG. 12B, the output signals corresponding to the dummy pixel, which are the voltages V1 and V2, are respectively amplified by the low gain GainL in the column amplifier 130, and AD conversion is performed using the first ramp signals VRAMP1 and the second ramp signal VRAMP2, so that V1HL, V2HL, V1LL, and V2LL are obtained. V1HL corresponds to the voltage V1 amplified by the low gain GainL and AD converted by the ramp signal VRAMP1, V2HL corresponds to the voltage V2 amplified by the low gain GainL and AD converted by the ramp signal VRAMP1, V1LL corresponds to the voltage V1 amplified by the low gain GainL and AD converted by the ramp signal VRAMP2, and V2LL corresponds to the voltage V2 amplified by the low gain GainL and AD converted by the ramp signal VRAMP2. The multiplication factor n, which corresponds to a ratio of an inclination of a line consisting of V2HH and V1HH to an inclination of a line consisting of V2HL and V1HL, is obtained by the following formula (3).

$$n = (V2HH - V1HH)/(V2HL - V1HL) \qquad (3)$$

After obtaining the multiplication factor n, the offset value can be determined so that the two straight lines in FIG. 12A intersect at the determination level Vth, and the offset value can be determined so that the two straight lines in FIG. 12B intersect at the determination level Vth. Specifically, the offset value can be determined, in each gain (GainH, GainL), such that an AD converted value obtained by multiplying the inclination of the second ramp signal by n becomes the value same as the value obtained by AD conversion by the first ramp signal, at the determination level Vth.

The above calculation may be performed by a circuit inside the image pickup device or by the image processing LSI 2. By using the multiplication factor n and the offset value obtained as described above, the linearity characteristics for synthesizing the image with the low gain GainL and the image with the high gain GainH can be further improved.

Embodiment 3

In Embodiment 2, the correction value in real time can be obtained. However, in a case where the offset value is calculated based on values that have been AD converted using a plurality of slopes (for example, using V2HL and V2LL), a correct offset value may not be obtained due to AD conversion errors when a plurality of slopes is used. Accordingly, in Embodiment 3, when the linearity characteristics are obtained, the offset value for correcting the linearity characteristics may be acquired only from AD converted values using one of ramp signals.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions. Meanwhile, a computer program for realizing some or all of the controls in the present Embodiment and the functions of the above-described Embodiments may be supplied to an image processing device through a network or various storage mediums. In addition, a computer in the image processing device (or a CPU, an MPU, or the like) may read and execute programs. In this case, the programs and a storage medium storing the programs constitute the present disclosure.

This application claims the benefit of Japanese Patent Application No. 2020-52491 filed on Mar. 24, 2020, and Japanese Patent Application No. 2021-018551 filed on Feb. 8, 2021, which are hereby incorporated by reference herein in its entirety.

What is claimed is:

1. An image pickup apparatus comprising:
at least one processor or circuit configured to function as:
an AD conversion unit configured to perform AD conversion of input signals by comparing a first ramp signal or a second ramp signal having a different inclination from the first ramp signal;
a first synthesis unit configured to synthesize a first signal on which AD conversion has been performed by comparing the first ramp signal and a second signal on which AD conversion has been performed by comparing the second ramp signal;
a first correction unit configured to correct a level difference between the first signal and the second signal when the first signal and the second signal are synthesized by the first synthesis unit;
an amplifier configured to amplify pixel signals by different gains;
a second synthesis unit configured to synthesize the signals that have been amplified by the different gains, and
a second correction unit configured to correct a level difference between the signals amplified by the different gains when the signals amplified by the different gains are synthesized by the second synthesis unit.

2. The image pickup apparatus according to claim 1, wherein the AD conversion unit performs the AD conversion on the signals that have been read out by the amplifier.

3. The image pickup apparatus according to claim 1, wherein the first correction unit correct the level difference between the first signal and the second signal by a multiplication factor and an offset.

4. The image pickup apparatus according to claim 1, wherein the second correction unit corrects at least a ratio of the signals that have been amplified by the different gains.

5. The image pickup apparatus according to claim 1, wherein the second correction unit has a memory that stores in advance linearity characteristics of the signals that have been amplified by the different gains.

6. The image pickup apparatus according to claim 1, wherein the second correction unit corrects the level difference between the signals amplified by the different gains when the signals amplified by the different gains are synthesized by the second synthesis unit based on a value of the AD conversion performed on a signal from a dummy pixel by the AD conversion unit.

7. The image pickup apparatus according to claim 1, wherein the second correction unit corrects the level difference between the signals amplified by the different gains when the signals amplified by the different gains are synthesized by the second synthesis unit based on a value of AD conversion performed on a signal from a dummy pixel using the first ramp signal and the second ramp signal.

8. The image pickup apparatus according to claim 1, wherein the amplifier is an analog amplifier that can change gains.

9. A non-transitory computer-readable storage medium that stores a computer program for an image pickup device with a processor that executes the following steps:
performing AD conversion of input signals by comparing a first ramp signal or a second ramp signal having a different inclination from the first ramp signal;
performing a first synthesis for synthesizing a first signal on which AD conversion has been performed by comparing the first ramp signal and a second signal on which AD conversion has been performed by comparing the second ramp signal;
performing a first correction for correcting a level difference between the first signal and the second signal when the first signal and the second signal are synthesized by the first synthesis;
amplifying pixel signals by different gains;
performing a second synthesis for synthesizing the signals that have been amplified by the different gains, and performing a second correction for correcting a level difference between the signals amplified by the different gains when the signals amplified by the different gains are synthesized by the second synthesis.

* * * * *